Figure 1:
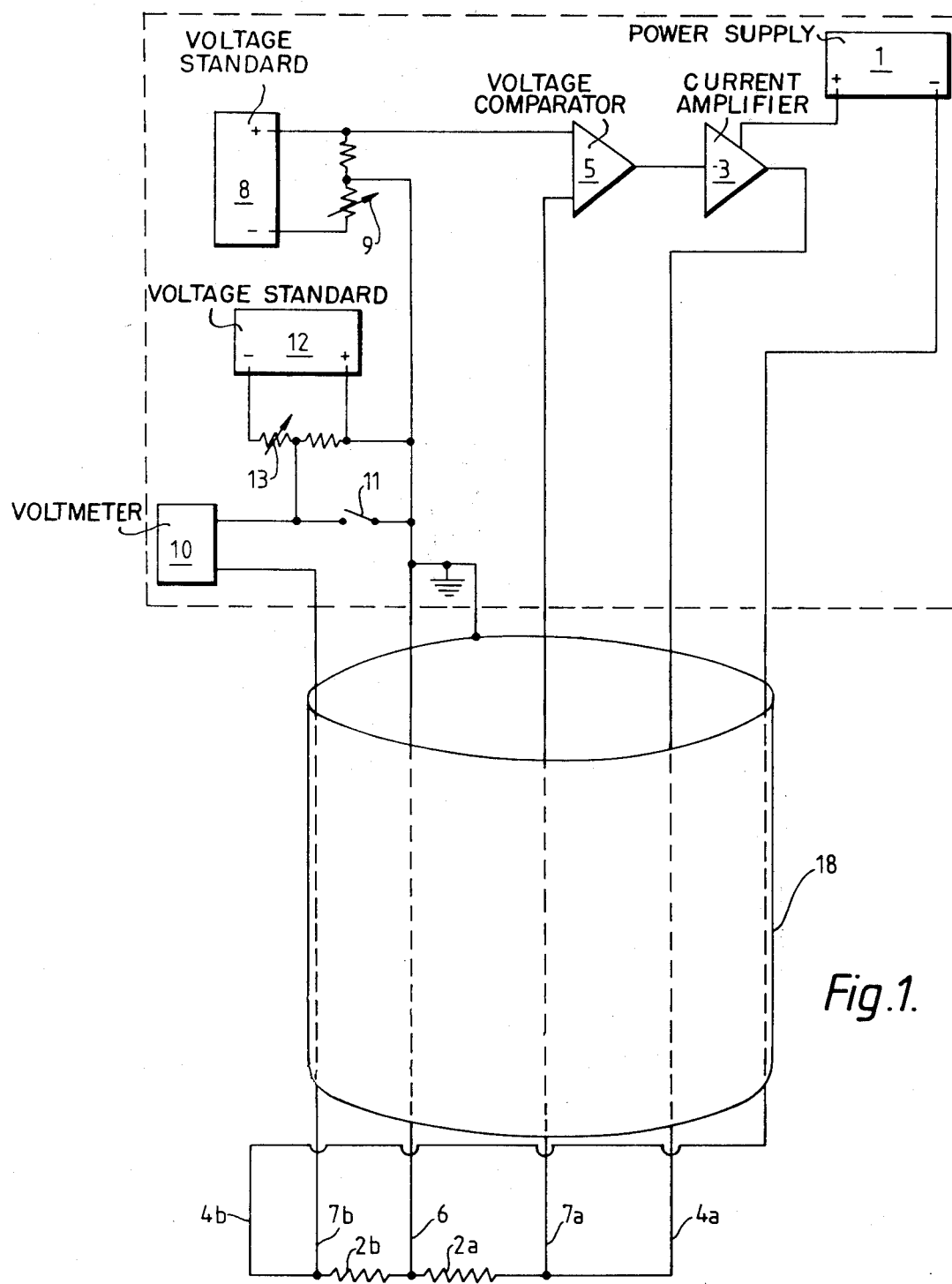

United States Patent [19]

Quayle

[11] 4,398,145

[45] Aug. 9, 1983

[54] ELECTRICAL RESISTANCE MEASUREMENT

[75] Inventor: Joshua C. Quayle, Stockton-on-Tees, England

[73] Assignee: Imperial Chemical Industries Limited, London, England

[21] Appl. No.: 217,150

[22] Filed: Dec. 16, 1980

[30] Foreign Application Priority Data

May 8, 1980 [GB] United Kingdom ................. 8015220

[51] Int. Cl.³ .......................................... G01R 27/02
[52] U.S. Cl. .................................. 324/62; 324/65 R; 324/65 CR
[58] Field of Search .................. 324/62, 65 R, 65 CR; 73/342, 362 AR

[56] References Cited

U.S. PATENT DOCUMENTS

| 3,056,082 | 9/1962 | Redding | 324/62 |
| 3,067,386 | 12/1962 | Freedman . | |
| 4,038,975 | 8/1977 | Vrana et al. | 324/62 X |
| 4,109,196 | 8/1978 | Carmody . | |
| 4,322,679 | 3/1982 | Moore et al. | 324/62 |

FOREIGN PATENT DOCUMENTS

| 614861 | 2/1961 | Canada | 73/362 AR |
| 2340158 | 11/1974 | Fed. Rep. of Germany . | |
| 2507732 | 9/1976 | Fed. Rep. of Germany . | |

OTHER PUBLICATIONS

H. Helke, "Gleichstrommessbrucken, Gleichspannungskompensatoren und ihre Normale" (1974), pp. 93, 118-119.

Primary Examiner—Stanley T. Krawczewicz

[57] ABSTRACT

Monitoring the change of resistance of a test element by passing a current through the element in series with a standard element, comparing the voltage across the test element with a standard voltage to produce a signal dependent on the difference between the voltages, feeding said signal to a current modifier so as to vary the current to maintain the voltage across the test element constant, and monitoring the change in voltage across the standard element.

9 Claims, 2 Drawing Figures

ELECTRICAL RESISTANCE MEASUREMENT

This invention relates to the measurement of electrical resistance of an electrically conductive member.

The electrical resistance of an electrically conductive member, hereinafter referred to as an element, depends on a variety of parameters, e.g. its length, cross-sectional area, temperature etc. It is often desired to detect small changes in one or more of said parameters of an element compared with a similar element in which the parameter is not changing. This may be done by comparison of the electrical resistance of the two elements.

Heretofore resistances have been measured or compared using a variety of bridge methods but these suffer from a number of disadvantages. Thus except where the resistance of the elements is large in comparison with the resistance of the electrical leads connecting the elements to the test equipment, the lead resistances often cannot be neglected and this renders the required apparatus complex. Generally it is not practical to locate the test equipment at a location remote from the elements, as is often desirable in industrial applications, if precision measurements are required.

It has been proposed in U.S. Pat. No. 3,067,386 to employ a potentiometric method avoiding the use of bridge networks to measure the resistance of an element by passing an electric current through the test element and a reference element connected in series therewith, adjusting the current to give a constant voltage drop across the test element and measuring the voltage drop across the reference element. The current is adjusted manually by means of suitable variable resistances until a null detector, e.g. a galvanometer, comparing the potential difference across the test element with a standard potential difference gives a zero reading.

It would be desirable to devise a system that did not require manual adjustment of the current.

Accordingly we provide a method of monitoring a resistance-modifying parameter of a test element comprising passing a current through said element connected in series with a reference element in which said parameter is maintained constant, comparing the potential difference across said test element with a standard potential difference to produce a signal dependent on the difference between said potential differences, feeding said signal to a current modifier in series with said test and reference elements to modify the current flowing through said elements in response to said signal to maintain said potential difference across said test element constant, and monitoring the potential difference across the reference element.

We also provide apparatus for monitoring a resistance-modifying parameter of a test element comprising the test element connected in series with a reference element in which said parameter is maintained constant, means to pass a current through said elements, means to compare the potential difference across said test element with a standard potential difference and to produce a signal dependent on the difference between said potential differences, means operated by said signal to vary the current flowing through said elements to maintain said potential difference across the test element constant, and means to monitor the potential difference across the reference element.

The elements should be mounted so that should resistance-modifying parameters, other than that which is being monitored, vary then they will vary in like manner in each element. Thus where it is desired to monitor the element thickness and the elements are liable to temperature variation, then the elements should be mounted so that both elements are subject to the same temperature variations. To this end the elements are preferably similar although they are not necessarily identical. For example where the present invention is used to monitor corrosion by monitoring the thickness of a test element exposed to a corrosive enivronment, the reference element is preferably formed from the same material as the test element but is protected from corrosion by a suitable coating: the reference element need not however have the same length or thickness as the uncorroded test element.

The invention is of particular utility where the resistance of the element is inversely proportional to the parameter, e.g. thickness, being studied, since the monitored potential difference across the reference element is directly proportional to the monitored parameter.

A biasing potential may be applied to the potential difference monitoring device (hereinafter termed a voltmeter although it will be appreciated that other forms of potential difference monitoring devices may be used). If the biasing potential is equal, but opposite in polarity, to the potential difference across the reference element when the monitored parameter or the test element has a predetermined value, the net potential difference, e.g. voltage indicated by the voltmeter, is a measure of the change in the parameter under study rather than of its absolute value.

One embodiment of the invention is illustrated by reference to the accompanying FIGS. 1 and 2 which are circuit diagrams; FIG. 2 showing modifications of the circuit desirable in some cases.

Figure 2:
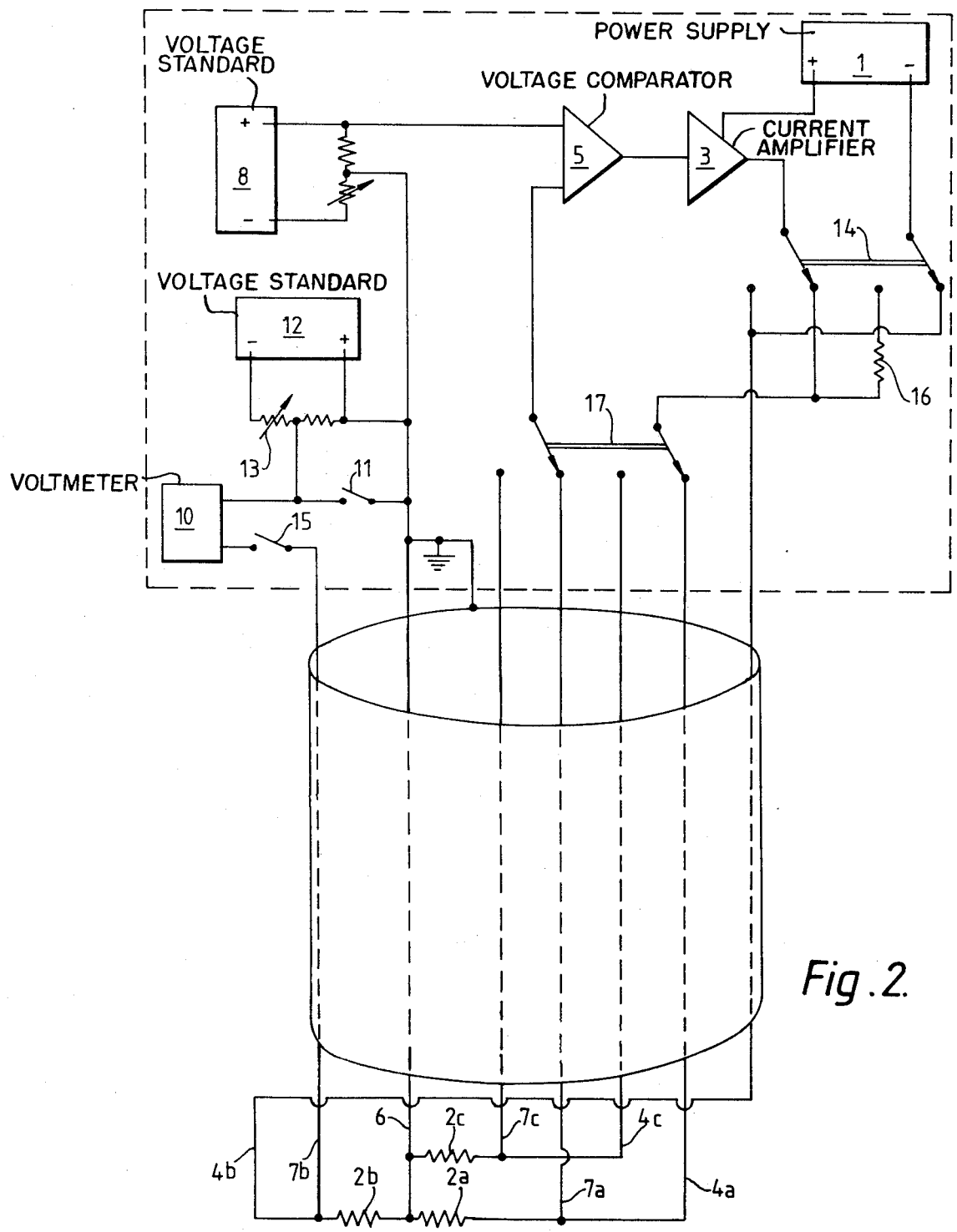

The circuit shown in FIG. 1 comprises a direct current power supply 1 which feeds a current through the elements 2a, 2b, whose resistances are to be compared, connected in series, via a solid state, integrated circuit, current amplifier 3 through leads 4a, 4b. The voltage drop Va, typically arranged to be about 20 mV, across the test element 2a is fed back to a solid state, integrated circuit, voltage comparator 5 via leads 6 and 7a, where it is compared with a standard voltage, e.g. 20 mV, obtained from a voltage standard 8 feeding a potential divider having an adjustable resistance 9 by means of which the standard voltage can be preset. The output signal from the voltage comparator 5 controls the current amplifier 3 to modify the current flowing through the elements 2a, 2b to maintain the voltage drop Va across element 2a constant and equal to the preset standard voltage.

The voltage drop Vb across reference element 2b can be monitored by a voltmeter, e.g. a digital voltmeter, 10 connected to leads 6 and 7b via on-off switch 11. When switch 11 is open, a biasing voltage is applied to the voltmeter 10. This biasing boltage is obtained from a voltage standard 12 feeding a potential divider having an adjustable resistance 13 by means of which the biasing voltage can be preset. If the bias voltage is made equal to the voltage drop Vb across the reference element 2b, the net voltage registered by the voltmeter 10 is zero.

The circuit can be used to monitor the change in thickness of an element as follows. Since the resistance R of an element 2 is inversely proportional to its thickness t $$(Rb/Ra) = (ta/tb)$$

and so $$(Vb/Va)=(ta/tb)$$

Therefore $$(Vb=(Va/tb)\cdot ta$$

Hence the voltage drop Vb across the reference element 26, is directly proportional to the thickness of the test element 2a, and so, as the thickness of test element 2a changes, the voltage drop Vb across reference element 2b changes proportionally.

By making the bias voltage equal to Vb when the test element 2a is in the original state, the voltage indicated by the voltmeter 10 is directly proportional to the change in thickness. The voltmeter can therefore be calibrated in terms of thickness change. When switch 11 is closed, the bias voltage is shorted out so that the voltage indicated by voltmeter 10 is directly proportional to the thickness of the test element 2a.

One application of the invention is in the shaping of metals, particularly the machining e.g. by turning, rolling, or grinding, of thin sectioned components. In this case a preformed component of the desired size may be used as the reference element 2b while the component being shaped is used as test element 2a. If the test element is being machined so that its thickness is being reduced, the voltage drop across reference element 2b can be used to control the machining operation: for example, as the voltage drop across element 2b approaches the desired level, the depth of cut can be reduced and machining stopped when the voltage drop reaches a predetermined level. Thus the machining may be stopped when the net indicated voltage is zero if a bias voltage is applied equal to the voltage drop across element 2b when element 2a has the desired size.

Another application of the invention is in accurate differential temperature measurement using resistance thermometry. The element 2b is maintained at a fixed reference temperature while the element 2a is maintained at the temperature to be measured. The difference in resistance between the two elements, and hence the indicated voltage, if a suitable bias voltage is applied, is a measure of the difference in temperature between the two elements.

Another application where the invention is of particular utility is the monitoring of corrosion occuring in vessels or pipework. A test element 2a is located in the vessel or pipe subject to the corrosive environment and as the element corrodes its thickness is reduced and so its electrical resistance increases. The reference element 2b is preferably located adjacent to the test element 2a but protected from corrosion by a suitable coating. A check element, also protected from corrosion, may also be provided adjacent the reference element. The purpose of the check element is to indicate, by comparison of its resistance with that of the reference element, whether an open circuit indication, i.e. an indicated zero thickness, of the test element is a result of such complete corrosion that the test element breaks or is a result of a fault in the circuit. To cater for the check element, the circuit may be modified as shown in FIG. 2. In this modification, to avoid cathodic protection of the test element occuring and retarding corrosion, the polarity of the current flowing through the test element can periodically be reversed by means of a reversing switch 14 located in the current supply to the elements. Conveniently reversing switch 14 is driven at half the mains frequency i.e. 25 Hz by conventional means not shown.

With some types of voltmeter 10, to protect the latter, particularly where the polarity of the current is reversed, it is desirable to incorporate an on-off switch 15 in the lead 7b to the voltmeter. When a measurement is to be taken, e.g. by closing switch 15 if present, the reversing switch 14 must be held in the position shown in FIG. 2. When switch 14 is in the other position, the polarity of the feed-back voltage to voltage comparator 5 is reversed thus driving the output thereof to saturation, thus tending to drive the current amplifier 3 to saturation. To limit the current when the polarity is in this reversed state, a resistance 16 is provided in series with the elements.

While cathodic protection could be avoided by applying the current to the elements only at intervals when a measurement is to be taken, e.g. by providing an on-off switch in series with the elements 2a, 2b in place of reversing switch 14, we prefer to maintain a current flowing through the elements to eliminate errors caused by varying thermoelectric voltages produced as the apparatus warms up to its equilibrium state. Where a check element 2c is connected in parallel with the test element 2a, as described below, cathodic protection and polarity reversal can be avoided, yet the equipment maintained at its equilibrium temperature, by maintaining the current through the check element 2c and only switching it to flow through the test element 2a when a measurement is required.

The check element 2c is connected in parallel with the test element 2a using a two-pole two-way switch 17 having one pole interposed between the reversing switch 14 (if used) and the elements 2a, 2c and switching between the current application leads 4a, 4c and the other pole interposed in the voltage feedback line to voltage comparator 5 and switching between the voltage feed-back lines 7a, 7c. To avoid errors resulting from thermoelectric effects, even when the current to the elements is maintained, the equipment shown within the dotted lines is preferably maintained at a constant temperature, e.g. by mounting in a thermostatted enclosure.

The leads 4, 6, 7 to the elements 2 are preferably enclosed within an earthed screened cable 18. To avoid errors resulting from the resistances of the leads, the leads 4a, 4b used to supply the current to the elements are separate from the leads 7a, 7b used, with lead 6, to feed the voltage drops across the elements to the voltage comparator 5 and to the voltmeter 10. Where the elements 2a, 2b are not connected directly together but are connected by a further lead, whose resistance is not negligible in comparison with the resistance of the elements, lead 6 should be duplicated: one lead 6 is connected to the element 2a and to the potential divider associated with voltage standard 8, while the duplicate lead 6 is connected to the element 2b and to switch 11 and to the biasing voltage standard 12. While it is not strictly necessary to use separate leads 4c, 7c for the check element 2c where one is employed in parallel with test element 2a, as described above, as the check element is only used to indicate the correct functioning of the equipment, the use of such separate leads 4c, 7c is preferred.

It will be appreciated that, by insertion of a precision rectifying system in the lead from switch 17 (if used) to voltage comparator 5 and in the lead 7b to the voltmeter 10, it is not necessary to hold switch 14 in the position shown in FIG. 2 when a measurement is to be taken, and also resistance 16 should then be omitted.

The check element 2c can be used to check the correctness of the bias voltage applied to voltmeter 10 by making the resistance of check element 2c (and, if necessary, an adjustable resistance in series therewith) equal to that of the test element 2a when the latter is in the uncorroded state. The bias voltage can thus be adjusted, by means of variable resistance 13, so that the sum of the bias voltage and the monitored voltage, i.e. the reading given on voltmeter 10, has a predetermined value, e.g. zero, equal to that given when the test element is in the uncorroded state, irrespective of the degree of corrosion of the test element.

Providing the input impedances to the voltmeter 10 and voltage comparator 5 are very high in comparison to the resistances of the elements 2 and the leads 6, 7, the effects of the resistances of leads 6, 7 can be neglected.

I claim:

1. A method of monitoring a resistance modifying parameter of a test element by passing a current through said test element and a reference element connected in series therewith, maintaining the resistance modifying parameter of said reference element constant, varying said current to maintain the potential difference across the test element constant, and monitoring the potential difference across the reference element, characterised by varying the current by comparing the potential difference across the test element with a standard potential difference, producing a signal dependent on the difference between said potential differences, feeding said signal to a current modifier in series with the test and reference elements, whereby said current is varied in response to said signal to maintain the potential difference across the test element at a preset value.

2. A method according to claim 1 including the step of applying a biassing potential difference to the monitored potential difference across the reference element, said biassing potential difference being equal, but opposite in polarity, to the monitored potential difference across the reference element when the resistance modifying parameter of the test element has a predetermined value, whereby the sum of the biassing potential difference and the monitored potential difference across the reference element is indicative of the change in the resistance modifying parameter of the test element from said predetermined value.

3. A method according to claim 2 in which the biassing potential difference is checked, and adjusted if necessary, by switching the current from the test element to a check element connected in parallel with said test element, comparing the standard potential difference with the potential difference across the check element instead of with the potential difference across the test element to generate the signal to vary the current to maintain the potential difference across the check element equal to the preset constant value, said check element having a resistance equal to that of the test element when the resistance modifying parameter of the test element has said predetermined value, maintaining the resistance modifying parameter of the check element constant, and varying, if necessary, the biassing potential difference until it is equal, but opposite in polarity, to the monitored potential difference across the reference element.

4. Apparatus for monitoring a resistance modifying parameter of a test element comprising a test element connected in series with a reference element in which said resistance modifying parameter is maintained constant, means to pass a current through said elements, means to vary said current, means to compare the potential difference across the test element with a standard potential difference, and means to monitor the potential difference across the reference element, characterised in that the means to compare the potential difference across the test element with a standard potential difference includes means to produce a signal dependent on the difference between the potential difference across the test element and the standard potential difference, and said means to vary the current is operated by said signal to vary said current to maintain the potential difference across the test element at a preset value.

5. Apparatus according to claim 4 wherein the means to vary said current passing through the elements comprises a current amplifier controlled by a signal obtained from a voltage comparator comparing the potential difference across the test element with the standard potential difference.

6. Apparatus according to claim 4 or claim 5 wherein the means for monitoring the potential difference across the reference element is provided with means to apply a biassing potential difference of opposite polarity to the monitored potential difference.

7. Apparatus according to claim 4 or 5 including a check element connected in parallel with the test element and switch means to apply the current to the check element instead of to the test element and to compare the standard potential difference with the potential difference across the check element instead of with the potential difference across the test element.

8. Apparatus according to claim 7 in which the resistance of the check element is equal to that of the test element when the resistance modifying parameter of the test element has a predetermined value.

9. Apparatus according to claim 4 or 5 wherein the means to pass the current through the elements includes a reversing switch to reverse the polarity of the current passed through the test and reference elements.

* * * * *